US009450377B1

(12) United States Patent
Roff et al.

(10) Patent No.: US 9,450,377 B1
(45) Date of Patent: Sep. 20, 2016

(54) MULTI-EMITTER DIODE LASER PACKAGE

(71) Applicant: TRUMPF PHOTONICS INC., Cranbury, NJ (US)

(72) Inventors: Robert Wallace Roff, Westfield, NJ (US); Yufeng Li, Plainsboro, NJ (US); Hans-Georg Treusch, Princeton Junction, NJ (US); Stefan Heinemann, Highstown, NJ (US)

(73) Assignee: Trumpf Photonics, Inc., Cranbury, NJ (US)

( * ) Notice: Subject to any disclaimer, the term of this patent is extended or adjusted under 35 U.S.C. 154(b) by 3 days.

(21) Appl. No.: 14/702,852

(22) Filed: May 4, 2015

(51) Int. Cl.
*H01S 3/04* (2006.01)
*H01S 5/00* (2006.01)
*H01S 5/022* (2006.01)
*H01S 5/40* (2006.01)
*G02B 27/30* (2006.01)
*G02B 3/00* (2006.01)

(52) U.S. Cl.
CPC ......... *H01S 5/02248* (2013.01); *G02B 3/0037* (2013.01); *G02B 27/30* (2013.01); *H01S 5/005* (2013.01); *H01S 5/02272* (2013.01); *H01S 5/4025* (2013.01)

(58) Field of Classification Search
USPC ......................................... 372/34, 36, 50.12
See application file for complete search history.

(56) References Cited

U.S. PATENT DOCUMENTS

| | | |
|---|---|---|
| 7,515,346 B2 | 4/2009 | Govorkov et al. |
| 7,801,190 B2 | 9/2010 | Lorenzen et al. |
| 8,432,945 B2 | 4/2013 | Faybishenko |
| 8,437,086 B2 | 5/2013 | Du et al. |
| 8,611,389 B2 | 12/2013 | Shiraishi et al. |
| 9,054,482 B1 | 6/2015 | Li |
| 9,083,136 B1 | 7/2015 | Hasegawa et al. |
| 2014/0119394 A1 | 5/2014 | Schleuning et al. |

OTHER PUBLICATIONS http://www.dilas.com/pages/products.php?category=2 Dilas—The diode laser company (internet website) Publication date unknown.
http://www.limo.de/en/products-solutions/micro-optics/beam-transformation-system/ Beam Transformation System (Internet website) Publication date unknown.

*Primary Examiner* — Jack Dinh
(74) *Attorney, Agent, or Firm* — Graham Curtin, P.A.

(57) ABSTRACT

A laser diode assembly contains a plurality of laser diode chips packaged closely in a row. Each laser diode chip is bonded on both P-side and N-side to first and second sub-mounts. The sub-mounts are then attached to a cooling carrier, with both bonding surfaces perpendicular to the top surface of the carrier. The direction of laser radiation is parallel to the carrier top surface, and the distance between the top of the active area of the laser diode chip and the carrier is preferably in a range of half a pitch between individual laser sources packaged in a row or preferably in a range of 0.2 mm to 1 mm to allow efficient cooling for high power operation. The sub-mounts may be electrically conductive, or they may be of insulating material at least partially covered with a conducting layer. A laser diode chip is bonded uniquely to a set of sub-mounts or may share a sub-mount with another laser diode chip.

20 Claims, 11 Drawing Sheets

MULTI-EMITTER DIODE LASER PACKAGE

FIELD OF THE INVENTION

This invention relates to diode laser packages. More specifically, it relates to multiple emitter diode laser packages used in high power applications, such as cutting and welding.

BACKGROUND OF THE INVENTION

A laser diode chip is a semiconductor device, as it is known to the person skilled in the art. It generally comprises a single broad area emitting laser light. Typical dimensions are also state of the art and are 2-5 mm cavity length, preferably 4 mm. A typical width of the laser diode chip is 0.4 mm to 0.6 mm and a typical width of the emitting broad area (active area) of 50 µm to 1001 µm, preferably 90 p.m. A typical height of the emitting broad area (active area) is 1 µm to 2 µm, preferably 1.1 µm. Other sizes and dimensions of laser diode chips are possible. A laser diode chip refers to a device not packaged to any heatsink, and metalized according to the state of the art. The term single emitter laser diode is a standard term in the field.

Single emitter laser diode chips are commonly mounted flat with a relatively large surface onto a cooling surface. A laser diode chip's geometrical properties can be characterized as a relatively flat bar with two parallel large surfaces, and two sets of relatively narrow parallel surfaces, as is illustrated as element 202 in FIG. 2. In this conventional mounting, one of the large sides of the emitter laser diode chip is adjacent the cooling surface.

When high power is needed, multiple emitter laser diode chips are typically stacked together. Again, diode laser modules with multiple emitters typically mount the laser diode chips flat on the cooling surface with the relatively large surface. To stack the laser beams of each of the laser diode chips along the fast axis, most modules utilize a multi-step cooling base, where laser diode chips are mounted onto steps at different heights. In this case, each laser beam is collimated in the fast axis and slow axis separately, and turning mirrors are then used to steer all collimated laser beams to the same direction, thus causing all beams to be stacked in the fast axis. JDS Uniphase and IPG Photonics market multi-emitter modules similar to those described in this paragraph. These approaches may not be very compact.

The Trumpf bar-based diode laser product, TruDiode 3006, has eight emitters on one laser bar, and the beams are stacked along the fast axis, and then coupled into an optical fiber. A step-mirror assembly is used in to rotate the beams 90 degrees and achieve the stacking. This approach suffers from similar drawbacks already discussed.

LIMO Lissotschenko Mikrooptik GmbH of Dortmund, Germany makes a tilted lens array product, called BTS, that achieves similar goals. The BTS product however also has the drawbacks previously discussed.

Various attempts to vertically stack laser emitter chips have been made. These are discussed in the following paragraphs.

U.S. Pat. No. 7,801,190 to Jenoptik discloses, in one embodiment, a laser diode stack, which is sandwiched between two coolers and attached to these coolers employing a solder layer, which is discontinuous so that it doesn't short the laser diodes. Each laser diode chip in the stack is sandwiched between two sub-mounts of different thickness and placed in a symmetrical position relative to top and bottom edges of the sub-mounts. At least one disadvantage of the structure disclosed in U.S. Pat. No. 7,801,190 is the need to have symmetric cooling carriers on both sides of the laser diode. Another disadvantage is the relatively long heat dissipation path from laser emitter to cooling carrier.

U.S. Pat. No. 7,515,346 to Coherent discloses vertically stacked laser diodes. Each laser diode chip is soldered to an electrically insulation sub-mount, preferably of diamond, and bonded to a surface of a common heat sink. The sub-mounts are partially metallized to allow connecting the laser diodes chips in series via strip electrodes. At least one disadvantage of the laser diode chip assembly in U.S. Pat. No. 7,515,346 is the complexity of the cooling carrier design.

U.S. Pat. No. 8,611,389 to Shinko Electric shows the assemblage of a package component comprising a laser diode. Several package components may be attached to a heat block to form vertically stacked laser diodes. The laser diodes are connected to each other via solder layers and the wiring layers on the front and back side of each laser diode are shorted via a through hole in one of the walls forming package component. At least one disadvantage of the laser diode assembly in U.S. Pat. No. 8,611,389 is the complexity of the packaging process and the long heat dissipation path.

European Patent Application EP2477285A1 describes a multitude of laser diodes each comprising an arbitrary number of emitting apertures that are embedded in a medium with good thermal conductivity, such that all laser diodes are preferably oriented perpendicular to a common mounting surface and emit parallel to each other and preferably in the plane of the mounting surface. Thus a stack of laser diodes results with the laser diodes being oriented perpendicular to the mounting surface emitting parallel to the mounting surface. At least one disadvantage of this laser diode assembly is the electrical insulation and the electrical contacting of the individual laser diodes while ensuring good cooling and low stress in the laser diode. Furthermore the application claims this set-up to be used for spatial or spectral beam combining to enhance brightness, but does not describe or claim any method to align the emitting apertures to each other, which is an essential feature for high brightness diode laser systems As a result, new and improved apparatus and methods to achieve a vertical assembly of laser emitter diodes also called laser diode chips are needed.

SUMMARY OF THE INVENTION

One aspect of the invention involves mounting a plurality of laser diode chips vertically onto the cooling surface with a sub-mount on both P-side and N-side of the emitter laser diode chip, thereby orienting the laser diode chips in an advantageous position for stacking. Various embodiments of the plurality of laser diode chips are disclosed. A laser diode chip is herein defined as single emitter laser diode. The aspect of vertical orientation relates to an orientation of the different layers in a laser diode chip. A laser diode chip has a structure of stacked different layers, including an active layer. When the laser diode is oriented so that the layers are horizontally stacked, the laser diode chip is in a horizontal orientation. When the laser diode chip is oriented so that each layer is stacked vertically next to each other, the laser diode is in a vertical orientation.

Another aspect of the invention involves optimizing the heat dissipation of the laser diode chip by mounting it as close as possible to the heatsink and simultaneously optimizing the thickness of the sub-mount for best cooling and minimum pitch.

Another aspect of the invention involves arranging the centers of each emitter (laser diode chip) or emitter group of the individual laser diode chips in one line parallel to the heatsink with very high accuracy, such that a single cylindrical lens can be used for slow axis collimation of all laser diode chips.

Another aspect of the invention involves highly accurate mounting of the laser diode chips in stacking direction, such that a micro-optic lens array may be optionally used for collimating the beams of the individual laser diode chips in fast axis with a single micro-optic lens array. The accuracy of mounting relates to the accuracy of the alignment of the emitting areas of the laser diode chips, so that they are substantially on one line through the emitting areas.

Another aspect of the invention involves a circuit arrangement to conduct current that excites the plurality of laser diode chips in a novel method and apparatus that solves stress problems that arise from the mounting of a plurality of laser diode chips. These and other aspects of the present invention are discussed further below.

In accordance with one embodiment of the present invention, a laser diode chip assembly comprises a carrier base and a plurality of sub-mounts, each sub-mount attached directly or indirectly to the carrier base. It also includes a plurality of laser diode chips, each of the plurality of laser diode chips having two opposing bonding surfaces that are perpendicular to the surface of the carrier base, each of the two opposing bonding surfaces attached to one of the plurality of sub-mounts so that each of the plurality of laser diode chips is oriented relative to the carrier base and precisely aligned relative to two edges of the sub-mounts. These edges are (i) the front edge of the sub-mount and the emitting area of the laser diode chip parallel and flush to each other and (ii) relative to the edge of the sub-mount that is later mounted to the carrier at a distance optimized for cooling as described below. Each of the plurality of laser diode chips has an emitting area that can emit radiation parallel to the surface of the carrier base and parallel to the two opposing bonding surfaces when an electric current is applied. In accordance with an aspect of the invention, the distance from the bottom of each of the plurality of laser diode chips to the carrier base is not less than 10 microns, and the distance from the top of the active area of each laser diode chip to the carrier base is not greater than or not significantly greater than half of the pitch between neighboring laser diode chips.

The term "active area" is used herein and means the laser light emitting area or region that is part of the active layer of the laser diode chip. The terms emitting area, laser light or radiation emitting area and active area, mean the same herein. In accordance with other embodiments of the present invention, the distance from the center of the active area of each laser diode chip to the carrier base is aligned with a deviation from a median center line through the centers of the emitting areas or active areas of the laser diode chips that is less than a fraction of the width of the active area of the laser diode chip, and preferably less than 10% of the active area width.

The assembly can also comprise a fast-axis collimating lens at the exit facet of each of the plurality of laser diode chips. The fast-axis collimating lens in one embodiment of the present invention is a single lens array for the whole assembly. The single lens array is prefabricated if the positioning of the active areas or emitting areas of the individual laser diode chips in the assembly is predictably within a predetermined range.

In another embodiment of the present invention, shown in FIG. 5, the assembly of laser diode chips further comprises a plurality of conductive pads attached to the surface of the carrier base in a row with a space between adjacent conductive pads. The sub-mounts are conductive sub-mounts, and each successive pair of the plurality of conductive sub-mounts between a first and a last of the plurality of conductive sub-mounts has a mounting surface attached to one of the plurality of conductive pads. Each of the plurality of laser diode chips is positioned above the space between adjacent conductive pads.

In accordance with another aspect of the present invention, each one of the plurality of sub-mounts is the same size. Alternatively, in one embodiment of the present invention the thickness of each one of the plurality of sub-mounts is between 0.3 and 0.8 mm. Other thicknesses are possible.

In accordance with another aspect of the present invention, each combination of sub-mounts and laser diode chip is individually tested for laser emission before being mounted on the carrier base.

In accordance with another aspect of the present invention, each of the plurality of sub-mounts has a free surface opposing a surface attached to the carrier base that is not attached to another carrier. Thus, only one carrier is used.

In accordance with another aspect of the present invention, each laser diode chip is bonded to two of the plurality of sub-mounts that are not bonded with another laser diode chip. Thus, excluding the two end laser diode chips, there are two sub-mounts between each laser diode chip.

In accordance with another aspect of the present invention, the laser diode chip assembly includes a plurality of conductive pads attached to the surface of the carrier base in a row with a space between adjacent conductive pads. The sub-mounts are electrically conductive sub-mounts with a mounting surface, wherein only one of the plurality of conductive sub-mounts between a first and a last of the plurality of conductive sub-mounts has the mounting surface attached to one of the plurality of conductive pads. Each one of the plurality of laser diode chips being positioned above the space between adjacent conductive pads. In this embodiment, there is a single sub-mount between each laser diode chip. Thus, in this embodiment, each laser diode chip that is not an end laser diode chip in the assembly of laser diode chips is bonded to one of the plurality of sub-mounts that bonds to another adjacent laser diode chip.

In accordance with one aspect of the present invention, the assembly has five laser diode chips with a surface area of the base plate not greater than 20×10 mm². In accordance with an aspect of the present invention, the assembly has more than five laser diode chips with a surface area of the base plate not greater than 20×10 mm². In accordance with an aspect of the present invention, the assembly has up to 10 laser diode chips within a surface area of the base plate or carrier base not greater than 20×10 mm².

In accordance with another aspect of the present invention, a laser diode chip assembly comprises a carrier base and a plurality of sub-mounts, each of the plurality of sub-mounts being a ceramic material that is at least partially covered with a layer of conducting material, each of the plurality of sub-mounts being attached directly or indirectly to the carrier base. The assembly further includes a plurality of laser diode chips, one of the plurality of laser diode chips being positioned between each successive one of the plurality of sub-mounts such that it is electrically connected to the layer of conducting material that at least partially covers each successive one of the plurality of sub-mounts. Each one of the plurality of laser diode chips is vertically oriented relative to the carrier base and has an open surface that can emit radiation parallel to the surface of the carrier base.

In accordance with another aspect of the present invention, the conducting material covers a portion of each side of each sub-mount and also covers at least a bottom surface of each sub-mount which is adjacent the carrier base.

Alternatively, the conducting material covers a portion of each side of each sub-mount and also covers at least a top surface of each sub-mount which is not attached to the carrier base.

In accordance with another aspect of the present invention, the emitting areas of the laser diode chips assembled in one embodiment of the present invention are all aligned such that a single lens can be used for slow axis collimation. Therefore the emitting areas or active areas are aligned to each other such that the total width of all emitting areas in a stack is no larger than 110% of the width of an individual emitting area and that all emitting surfaces are aligned in one plane perpendicular to the beam propagation.

In accordance with another aspect of the present invention, the emitting areas of the laser diode chips assembled in one embodiment of the present invention are all aligned such that a single micro-lens array can be optionally used for fast axis collimation. Therefore the emitting areas of the individual laser diode chips are aligned in one plane perpendicular to the beam propagation direction with an accuracy of better than 1 μm and the pitch of the laser diode chips is aligned with an accuracy of better than 1 μm.

Other advantages of the invention will be appreciated from the claims, the description and the drawings. The features which have been mentioned above and those which are set out in greater detail below can also be used individually or together in any combination. The embodiments which are shown and described are not intended to be understood to be a definitive listing, but instead are of exemplary character in order to describe the invention.

In accordance with an aspect of the present invention a laser diode assembly is provided, comprising: a carrier base, a plurality of sub-mounts, each sub-mount in the plurality of sub-mounts attached directly or indirectly to the carrier base, a plurality of laser diode chips, each of the plurality of laser diode chips having two opposing bonding surfaces and an active layer that are perpendicular to the surface of the carrier base, each of the two opposing bonding surfaces attached to one of the plurality of sub-mounts so that each of the plurality of laser diode chips including the active layer is vertically oriented relative to the carrier base, each laser diode chip having an active area with a top relative to the carrier base that can emit radiation parallel to the surface of the carrier base and parallel to the two opposing bonding surfaces when powered by an electric current; and wherein a distance of the top of the active area of each of the plurality of laser diode chips to the carrier base is not greater than half a pitch, plus or minus 10%, between adjacent ones of the plurality of laser diode chips in the laser diode assembly.

In accordance with a further aspect of the present invention a laser diode assembly is provided, wherein the distance of the top of the active area of each laser diode chip in the plurality of laser diode chips to the carrier base is between 0.2 mm and 1 mm.

In accordance with yet a further aspect of the present invention a laser diode assembly is provided, wherein a distance between a bottom of each laser diode chip in the plurality of laser diode chips to the carrier base in the laser diode assembly is less than 50 microns.

In accordance with yet a further aspect of the present invention a laser diode assembly is provided, wherein a distance of a center of the active area of each laser diode chip in the plurality of laser diode chips to a median center line through the active areas of the laser diode chips in the plurality of laser diode chips is not greater than $\frac{1}{10}$ of a width of the active area of any of the laser diode chips.

In accordance with yet a further aspect of the present invention a laser diode assembly is provided, wherein each active area of a laser diode chip in the plurality of laser diode chips determines a plane perpendicular to radiation from the active area and perpendicular to the carrier to form a plurality of substantially parallel planes and a distance between any two planes in the plurality of planes is not greater than 1 micrometer.

In accordance with yet a further aspect of the present invention a laser diode assembly is provided, further comprising a single collimating lens to collimate laser radiation along the slow axis of the laser diode assembly.

In accordance with yet a further aspect of the present invention a laser diode assembly is provided, further comprising: a plurality of conductive pads attached to the surface of the carrier base in a row with a space between adjacent conductive pads; the sub-mounts being conductive sub-mounts, each of the plurality of conductive sub-mounts having a mounting surface attached to one of the plurality of conductive pads; and each of the plurality of laser diode chips being mounted on a conductive sub-mount at a position above the space between adjacent conductive pads.

In accordance with yet a further aspect of the present invention a laser diode assembly is provided, wherein each one of the plurality of sub-mounts has the same size.

In accordance with yet a further aspect of the present invention a laser diode assembly is provided, wherein a thickness of each one of the plurality of sub-mounts is between 0.3 and 0.8 mm.

In accordance with yet a further aspect of the present invention a laser diode assembly is provided, further comprising: a prefabricated microlens array for fast axis collimation of radiation generated by the plurality of laser diode chips.

In accordance with yet a further aspect of the present invention a laser diode assembly is provided, wherein the assembly has more than 5 laser diode chips and occupies an area not greater than 20 mm×10 mm.

In accordance with yet a further aspect of the present invention a laser diode assembly is provided, wherein each of the plurality of sub-mounts is made of a ceramic material that is at least partially covered with a layer of conducting material on a first side and a second side, each to be attached to a different laser diode chip.

In accordance with another aspect of the present invention a laser diode assembly is provided, comprising a carrier base; a plurality of individual sub-mounts, each of the plurality of sub-mounts being a ceramic material that is at least partially covered with a layer of conducting material on a first side and a second side, each to be attached to a different laser diode chip, each of the plurality of sub-mounts being attached directly or indirectly to the carrier base; a plurality of laser diode chips, each of the laser diode chips having a first and a second mounting side, each of the first and second mounting sides of the plurality of laser diode chips being attached and electrically connected to the layer of conducting material of a different sub-mount in the plurality of sub-mounts; wherein each one of the plurality of laser diode chips is vertically oriented relative to the carrier base and has an open surface that can emit radiation parallel to the surface of the carrier base; and wherein a distance of a top of an active area of each of the plurality of laser diode chips to the carrier base is not greater than half a pitch, plus or minus 10%, between individual laser diode chips in the laser diode assembly.

In accordance with yet another aspect of the present invention a laser diode assembly is provided, wherein the conducting material covers a portion of each side of each sub-mount and also covers at least part of a bottom mounting surface of each sub-mount to be mounted on the carrier base.

In accordance with yet another aspect of the present invention a laser diode assembly is provided, wherein the conducting material covers a portion of each side of each sub-mount and also covers at least a top surface of each sub-mount which is not attached to the carrier base.

In accordance with yet another aspect of the present invention a laser diode assembly is provided, wherein a distance of a center of the active area of each laser diode chip in the laser assembly to a median center line through the active areas of the laser diode chips in the laser diode assembly is not greater than 1/10 of a width of a widest active area of any of the laser diode chips in the laser diode assembly.

In accordance with yet another aspect of the present invention a laser diode assembly is provided, wherein the laser diode assembly has more than 5 and up to 10 laser diode chips within a surface area of the carrier base not greater than 20×10 mm².

In accordance with yet another aspect of the present invention a laser diode assembly is provided, further comprising: a single lens for slow axis collimation of radiation generated by the plurality of laser diode chips.

In accordance with yet another aspect of the present invention a laser diode assembly is provided, further comprising: a prefabricated microlens array for fast axis collimation of radiation generated by the plurality of laser diode chips.

In accordance with yet another aspect of the present invention a laser diode assembly is provided, wherein an offset between the active areas of two laser diode chips mounted on the carrier base is not greater than 1 micron.

DESCRIPTION

Figure 1:
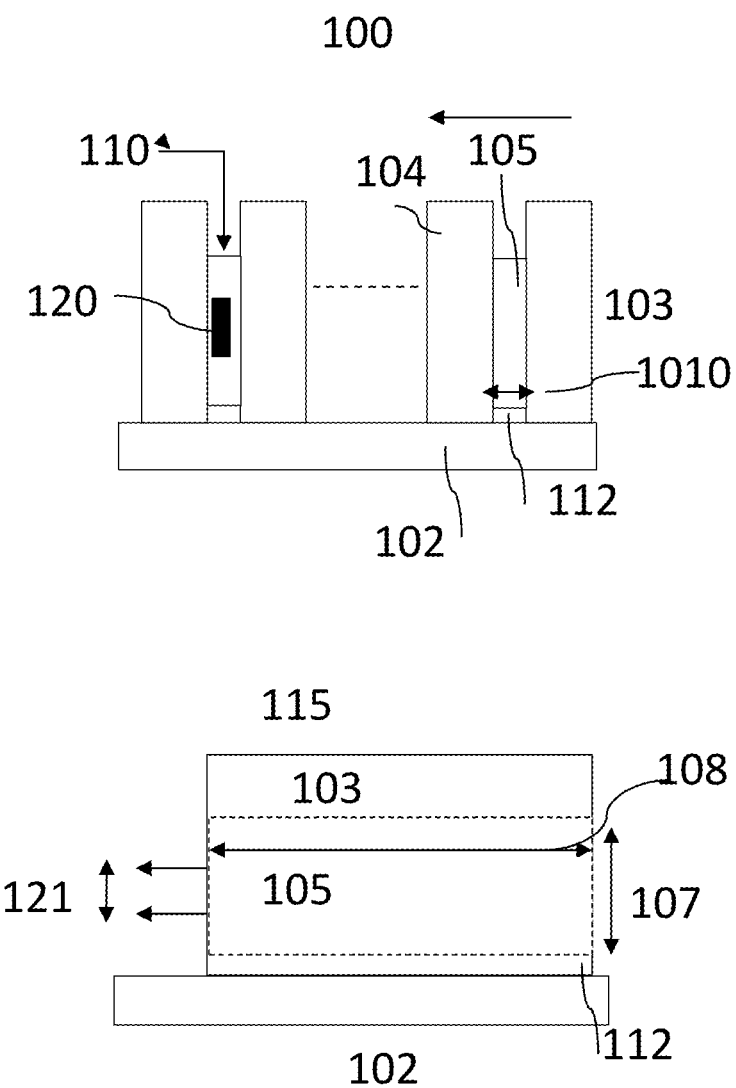
FIG. 1 illustrates laser diode chip mounted to a sub-mount.

Aspects of the present invention involves mounting the laser diode chip onto the cooling surface with sub-mounts on both P-side and N-side, thereby orienting the laser radiating emitting areas or active areas of the laser diode chips in the assembly such that the laser diode chips are in an advantageous position for stacking. In this invention, the laser diodes are mounted vertically, such that the length of a surface of the laser diode extending away from a carrier base is greater than the length of a surface of the laser diode that extends along a top surface of the carrier base (parallel to the carrier based).

A laser diode chip assembly comprises a carrier base and a plurality of sub-mounts, each of the plurality of sub-mounts being a ceramic material that is at least partially covered with a layer of conducting material, each of the plurality of sub-mounts being attached directly or indirectly to the carrier base. The assembly further includes a plurality of laser diode chips, one of the plurality of laser diode chips being positioned between each successive one of the plurality of sub-mounts such that it is electrically connected to the layer of conducting material that at least partially covers each successive one of the plurality of sub-mounts. Each one of the plurality of laser diode chips is vertically oriented relative to the carrier base and has an open surface that can emit radiation parallel to the surface of the carrier base.

Single-emitter diode laser diode chips (currently about 0.6 mm (W)×0.1 mm (H)×4 mm (L), but can be other sizes) are bonded with sub-mounts on both P-side and N-side. The sub-mounts can be either electrically conductive (CuW for example), or electrically isolating (BeO or AlN for example), depending on the embodiment of the invention. If the sub-mounts are electrically non-conductive, they include a conductive surface treatment (typically with thin metal film or thick film), and they have a second mounting surface perpendicular to the first surface with which laser diode chips are bonded.

This second surface is then used to mount the sub-assembly onto a carrier heatsink. Passing an electric current from the first sub-mount through the laser diode chip (or laser source) to the second sub-mount on the other side of the laser chip will activate the laser diode chip, causing it to emit light in a direction parallel to both mounting surfaces. Multiple chip-on-sub-mount (CoS) sub-assemblies can be placed side by side to stack the laser beams in the fast diverging optical axis (i.e. direction perpendicular to the first mounting surface), and they can be connected in series so that the electrical current pass through from the first laser chip to the last. The heat generated by the laser diode chips during operation is dissipated from chip to sub-mounts through first mounting surfaces and then to the carrier base heatsink through second mounting surfaces. The plurality of laser beams can be collimated in the "fast axis" and "slow axis" (i.e. direction parallel to the first mounting surface), resulting in a high-power free-space laser beam for direct use, or they can be further converted to create a fiber-coupled diode laser diode chip. Depending on the cooling performance of the heatsink, the CoS sub-assemblies can be placed away from each other to allow efficient cooling, or they can be packed closely to create a more compact laser module. In the extreme case, the whole stack of CoS subassemblies can become a multi-layer sandwich structure, where there is no air gap between two neighboring CoS sub-assemblies, and the two neighboring emitters can be bonded to the same sub-mount in between. In accordance with an aspect of the present invention a distance is selected advantageously to optimize for both heat transfer and optical coupling.

In the case of electrically conductive sub-mounts, with CuW as an example, the sub-mount should have good thermal and electrical conduction, and a thermal expansion property matched to the laser diode chip. As the chip is directly bonded onto the sub-mount, surface treatment (example Ni/Au plating) can be used to promote good adhesion. In addition, the cooling surface to which the CoS sub-assemblies are attached needs to be patterned into electrically conductive areas and electrically isolating areas, so that individual laser diode chips will not be shorted while maintaining a good thermal path. In the case where the sequence in a row of devices is sub-mount/laser/sub-mount/laser/sub-mount, the pads are not required to conduct electricity since all the current is passed from sub-mount to laser to sub-mount to laser directly. In one embodiment of the present invention, wherein the sequence is sub-mount/laser/sub-mount, sub-mount/laser/sub-mount, the carrier pads may be required to pass electricity between the two sub-mounts, particularly in the case where the adjacent sub-mounts may or may not be in physical contact with each other.

In the case of electrically isolating sub-mounts, with AlN as example, a conductive coating can be applied (typically metal) to the sub-mount. This coating can be either a thick film metallization (silver with other metal layers as example) or a thin film metallization (titanium plus other metals as example). The coating wraps from one side of the sub-mount to the other to make an electrical path from the P-side of one laser diode chip to the N-side of another laser diode chip. This conduction path is not electrically connected to the mounting surface in contact with the heatsink. Therefore, the cooling surface of the heatsink is not required to have electrically isolated patterns here.

FIG. 1 illustrates a configuration of a laser diode assembly. The assembly 100 shows a carrier 102 with two laser diodes sources each captured or sandwiched between sub-mounts which are mounted onto the carrier. The carrier 102 can be a single base that serves as a base for the mounted laser diode chips. It can also be a multi-layer base, such as a AlN—Cu—AlN base. In one embodiment of the present invention, cooling channels to conduct a cooling fluid are part of the base. View 100 shows a view into a radiating end of a radiating diode source 105 mounted on sub-mounts 104 and 103. Also identified is an identical mounted laser diode chip 110. In accordance with an aspect of the present invention, a row or series of mounted lasers is mounted on the carrier 102. The laser diode chip 105 has a thickness 1010 between the two sub-mounts 104 and 103. The laser diode chip is positioned at a distance 112 above carrier 102. For the laser diode to be operational, an electrical current has to flow between 103 and 104 through the laser diode chip. When an electric current flows through the chip 105, an active layer in the chip generates laser radiation which is emitted from an active area 120 of the laser chip. The configuration 100 is drawn with the visible surface 105 being the desired radiating surface that radiates laser radiation towards the viewer. The thickness 1010 coincides with the fast axis of the emitter. Additional laser diodes are placed on the carrier 102 but are not drawn to prevent overcrowding of the figure. Also omitted or not identified are the different possible electrical conductors that provide the operational current.

The view 115 in FIG. 1 shows a side view of the assembly. One would see in this view, only the side of a single sub-mount 103 on the carrier 102. To clarify, the laser diode chip 105 is identified in a dotted line. Also identified are the length 108 of the laser diode chip and a width 107 of the laser diode chip. The length of the laser diode chip in FIG. 1, as shown, is identical to the length of the sub-mount. The length of the laser diode chip 105 may also be shorter than the length of the sub-mount 103. The two arrows pointing to the left at the left side of elements 105 and 103 indicate the direction of laser radiation from the laser diode chip 105 and numeral 121 indicates the height, also called the width, of the active area from which laser radiation is emitted.

In both views 100 and 115 of FIG. 1, it is shown that laser diode chip 105 does not extend between the sub-mounts down to the carrier 102. Thus, the laser diode chips 105 do not touch the carrier 102. This is part of the design. One would not want the laser diode chip to touch the carrier, certainly not if the carrier is made of metal or has a conducting layer, as this may short circuit the laser diode chip. Furthermore, by touching the carrier the laser diode chip may experience undesirable stress during operation. However, in accordance with an aspect of the present invention, the lower side of the laser diode chip 105 is brought as close as possible to the carrier, which acts as a heatsink and may have a forced cooling system. In one embodiment of the present invention, the gap between the bottom of the laser diode chip and the carrier (including any layers attached to the carrier) is in a range of 10 micron to 500 micron. The 500 micron distance may be relatively easy to achieve. The 10 micron, however, may require careful and extensive positioning efforts, for instance, with a processor controlled robotic arm or placement device. One may require an operator looking through a microscope to guide the robotic arm and make a decision for placement during the placement operation.

Figure 2:
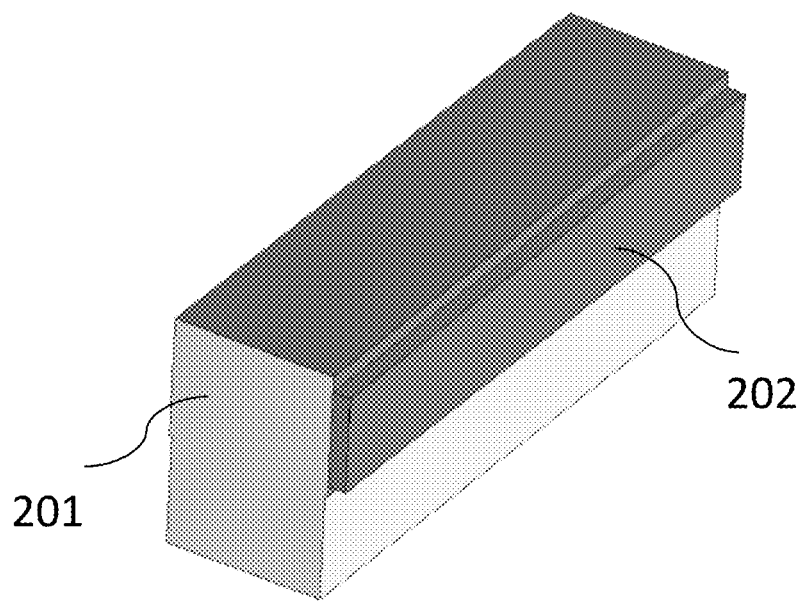
FIG. 2 illustrates a laser diode chip mounted on a single sub-mount.
Figure 3:
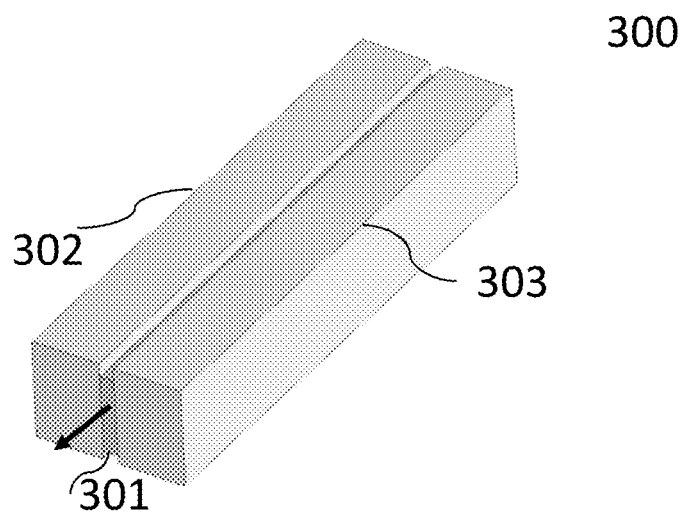
FIG. 3 illustrates a laser diode chip mounted between two sub-mounts.

The drawings of FIG. 1 also show that the placement of the laser diode chip between the sub-mounts may not be symmetrical. The free space above the laser diode chip to the top of the sub-mounts may be zero, wherein the laser diode chip is flush with the top of the sub-mounts or almost flush with the top of the sub-mounts. In accordance with an aspect of the present invention, the free space between the top of the laser diode chip and the top of the sub-mounts is preferably in a range of 0.25 to 0.5 mm. Alternatively, a larger area of free space between the top of the laser diode chip and the top of the sub-mounts can be provided. Also, the laser diode chip 105 can be shorter than each of the sub-mounts. However, it is preferred that the radiation surface of the laser diode chip 105 be provided at, or nearly at, the end surface of each sub-mount surrounding the laser diode chip 105. This allows the effective use of collimating lenses. The present invention involves a mounting of a laser diode chip on a sub-mount, as shown in FIGS. 2 and 3, so that the width of the laser diode (the surface with the smallest area) is facing the carrier. FIG. 2 illustrates in a perspective drawing, a partially mounted laser diode with sub-mount 201 and laser diode chip 202. The relative position of the laser diode chip relative to the edges of the sub-mount may not be to scale and reflect a specific embodiment of the present invention. FIG. 3 illustrates a laser diode chip 301 mounted on sub-mounts 302 and 303, which are preferably of the same size. This forms a stand-alone laser diode that may be tested for laser radiation before being mounted on a carrier. The arrow indicates the direction of the desired radiation, which is from a surface determined by the width and thickness of the laser diode chip 301.

Figure 4:
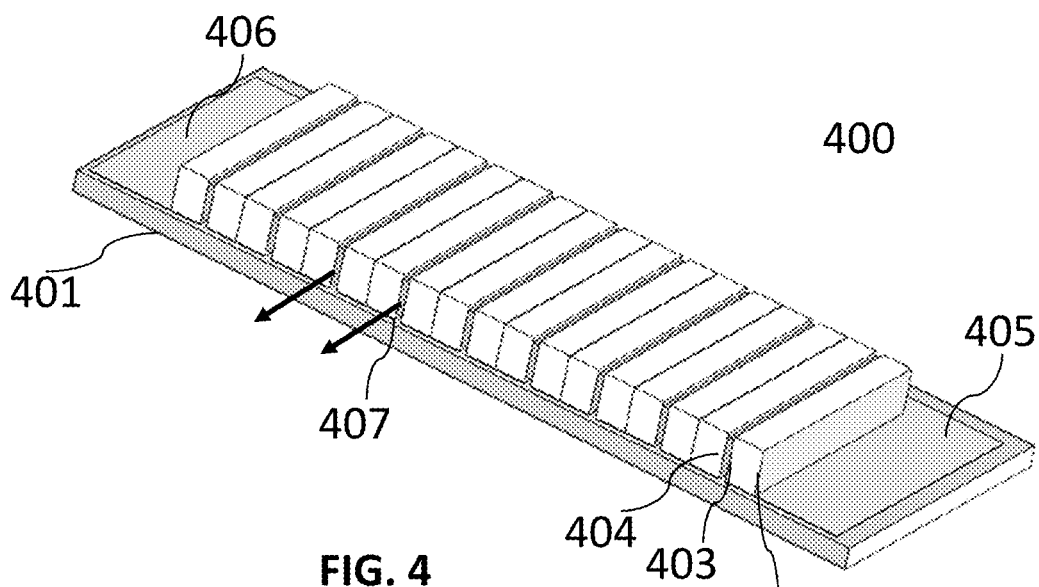
FIGS. 4 and 5 illustrate a first embodiment of the present invention.

Various aspects of the present invention will now be further discussed. In accordance with the present invention, as illustrated in the figures, an assembly of vertically oriented laser diodes on a surface of a single carrier base is provided. Referring to FIG. 4, the assembly 400 includes a plurality of laser diode chips 403 and a plurality of sub-mounts 402 and 404. Each sub-mount in the plurality of sub-mounts 402 and 404 is attached directly or indirectly to the carrier base 401. As previously mentioned, the carrier base 401 can be a multi-layer carrier, for example, a AlN—Cu—AlN carrier, which is well known.

In FIG. 4, each laser diode chip 403 has two opposing bonding surfaces that are perpendicular to the surface of the carrier base 401. Each one of the two opposing bonding surfaces are attached to one of the plurality of sub-mounts. Thus, considering laser diode chip 403, one of its bonding surfaces is attached to the sub-mount 402 and another is attached to the sub-mount 403.

As illustrated by arrow 407, each laser diode chip has an open radiation surface perpendicular to the surface of the single carrier base and perpendicular to the two opposing bonding surfaces, from which radiation is emitted. As illustrated in FIG. 4, there is a gap between the bottom of each of the laser diode chips and the surface of the carrier 401. In accordance with an aspect of the present invention, the size of the gap from the carrier to the laser diode is between 10 and 500 microns.

Figure 5:
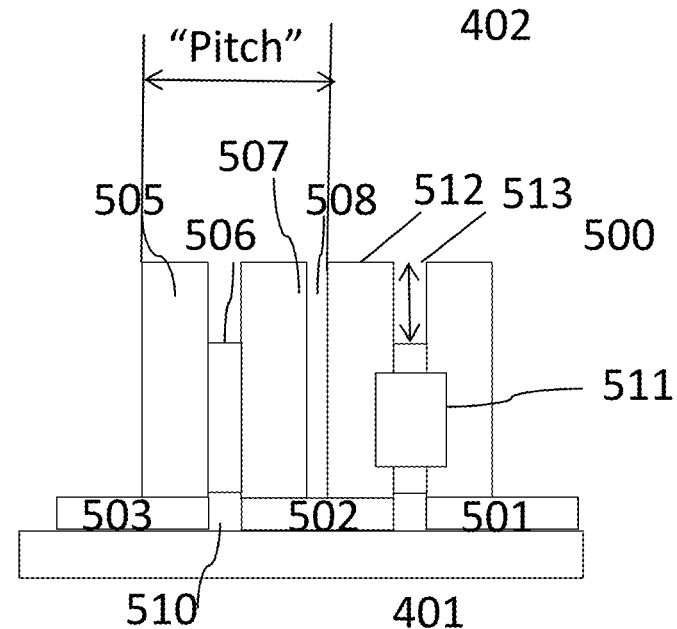
Figure 6:
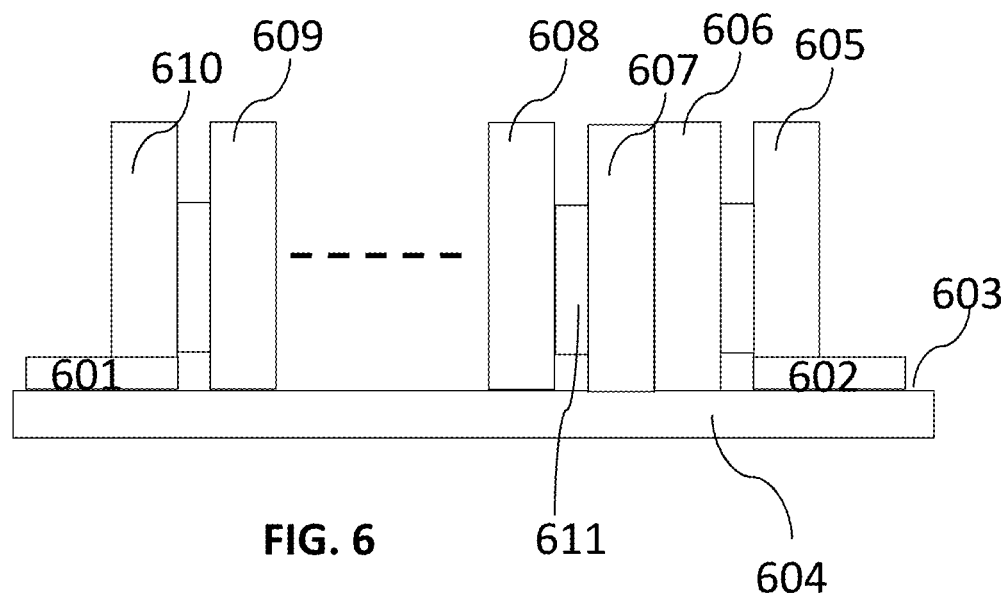
FIG. 6 illustrates an assembly of laser diode chips in accordance with an embodiment of the present invention.
Figure 7:
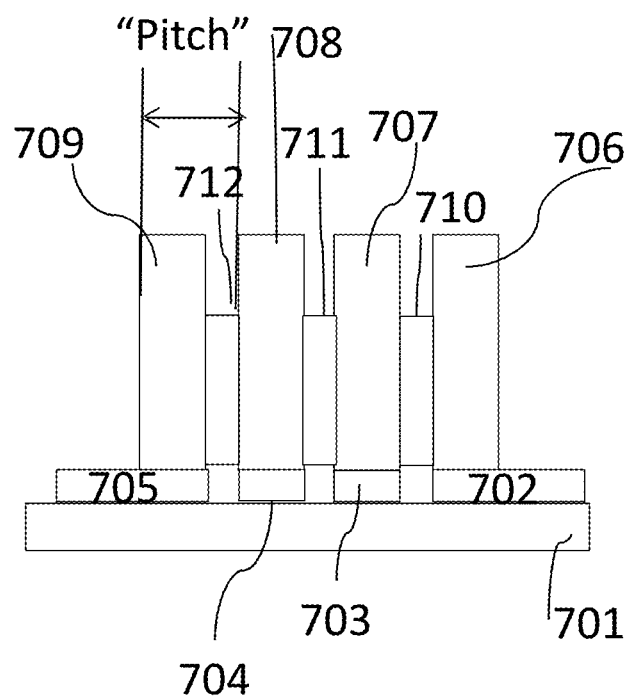
FIG. 7 illustrates another embodiment of the present invention.

In accordance with an aspect of the present invention, the pitch of the laser chip assembly determines a preferred distance of a laser diode chip to the carrier. Pitch is defined here as the period length of a spatially periodic structure. In the case of sandwiched CoS assemblies separated by an air gap, the pitch is the sum of the thicknesses of two sub-mounts, the chip, and the air gap. This is illustrated in FIG. 5. In the case of neighboring laser diode chips sharing one sub-mount in between, there will be no air gap, so the pitch will simply be the sum of thicknesses of one sub-mount and laser diode chip. This is illustrated in FIG. 7. In one embodiment of the present invention, two adjacent sub-mounts touch as is illustrated in FIG. 6. In that case the pitch is the sum of the thicknesses of two sub-mounts and the laser diode chip. In one embodiment of the present invention, two adjacent sub-mounts almost touch and may be connected through a connecting material, not being the laser diode chip. In that case the pitch is the sum of the thicknesses of two sub-mounts, any material that may be between the adjacent and almost touching sub-mounts, and the laser diode chip.

In one embodiment of the present invention a laser diode or laser source or laser diode chip is typically 100 m thick, and the sub-mount thickness may vary from 0.3 mm to 0.8 mm. The pitch may be as small as 0.4 mm and as large as 2 mm. Numbers outside this range are also possible. In one embodiment of the present invention a pitch is 0.2 mm or larger. In another embodiment of the present invention the pitch is greater than 2 mm but smaller than 3 mm.

Figure 14A:
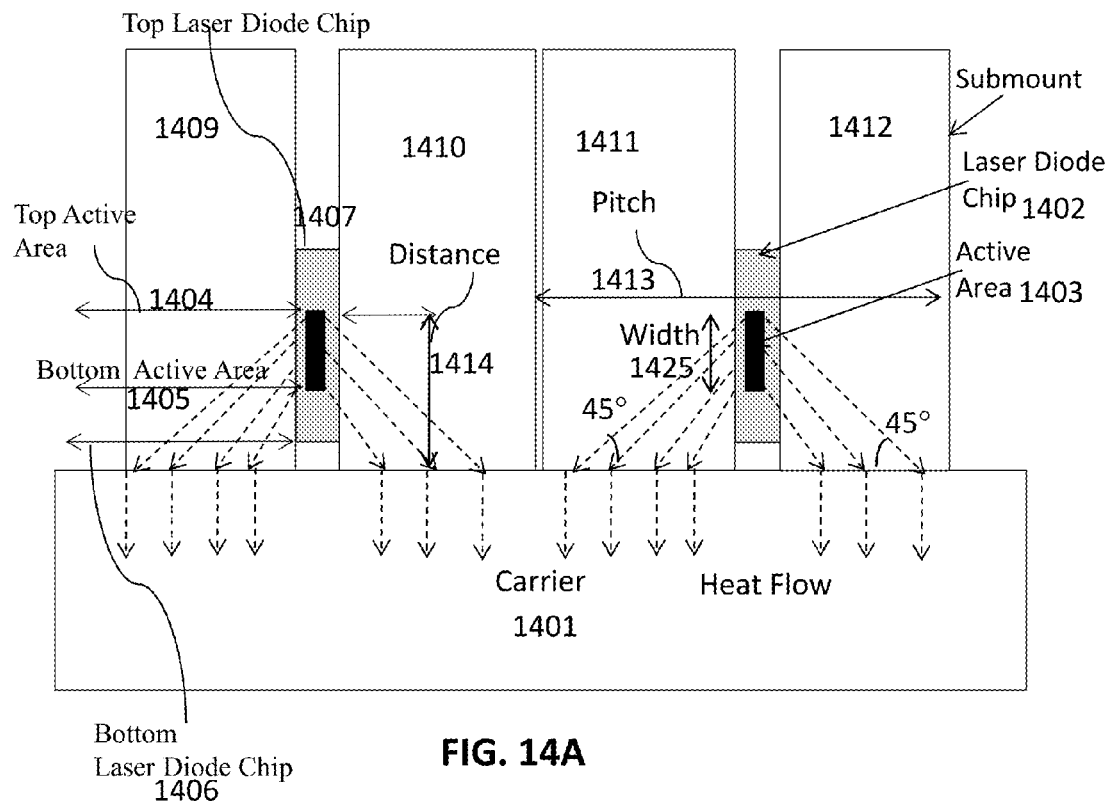
FIGS. 14A and 14B illustrate a cooling configuration in accordance with an aspect of the present invention.
Figure 14B:
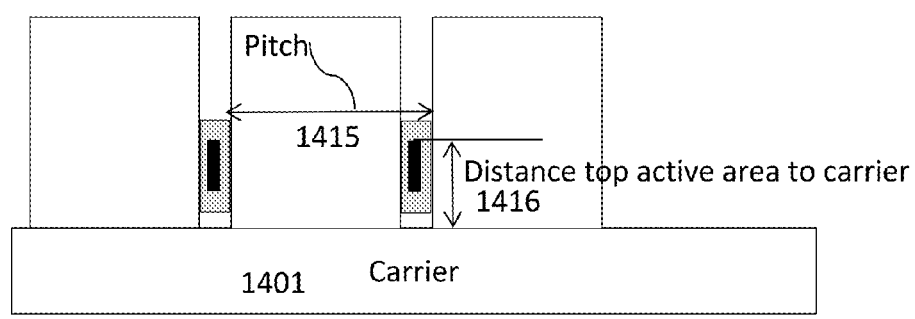

In accordance with an aspect of the present invention, a distance between the laser diode chip and the carrier is expressed in terms of "half pitch." This is intended to allow efficient heat dissipation of 45° or about 45° radiation angles from an active area of the laser diode chip via sub-mounts on both sides to the carrier, which acts as a cooler, as illustrated in FIG. 14A and FIG. 14B.

FIG. 14A and FIG. 14B illustrate examples of embodiments of the present invention. In particular, orientations and dimensions are illustrated. The assembly contains a plurality of laser diode chips of which 1402 is identified. The laser diode chip 1402 is sandwiched between two sub-mounts 1411 and 1412. Sub-mounts 1409 and 1410 sandwich a different laser diode chip. Accordingly, in FIG. 14A, there are two sub-mounts between neighboring laser diode chips. The pitch of this structure is thus based on two adjacent sub-mounts and is identified as arrow 1413. Each laser diode chip has an active area or region identified as area 1403 in laser diode chip 1402. The active area 1403 is the emitting area of 1402. The laser diode chips sandwiched between sub-mounts are mounted in a vertical orientation upon carrier 1401. The width 1425 of an active area 1403 is also identified as the dimension between the top and the bottom of the active area 1403.

A laser diode chip has a top relative to the carrier, identified as 1407 and a bottom identified as 1406. An active area or region of a laser diode chip has a top of the active area, the top of the active area being identified as 1404 and a bottom of an active area identified as 1405. The distance between 1404 and 1405 is the width of the active area. A distance from the top 1404 to the carrier 1401 is identified as 1414. In accordance with an aspect of the present invention, the distance 1414 is not greater than half the pitch between two neighboring diode laser chips or at least half of 1413. In an embodiment of the present invention, a distance between two adjacent diode laser chips in an assembly is determined by a common sub-mount shared by the two adjacent diode laser chips. Accordingly, a pitch between two diode laser chip depends on the combined size of intervening sub-mounts, which may be one sub-mount as in FIG. 14B or two sub-mounts as in FIG. 14A.

As described herein, and as illustrated in FIG. 14B, the laser diode chips in an embodiment of the present invention are mounted on opposing sides of a single sub-mount. In that case, as is illustrated in FIG. 14B, the pitch is defined by arrow 1415 and the minimum distance 1416 of the top of the laser diode chip to the carrier 1401 is not greater than half of 1415.

If the laser distance from the cooling carrier increases to more than half the pitch, heat flow from neighboring laser diode chips will overlap in the center area between the two laser diode chips, causing laser temperature to rise much faster than when the distance is less than half the pitch. For efficient high power operation, there is a preferred distance, based on the 45° condition, that requires or at least strongly suggests that the top of the active area of the laser diode chip is preferably at a height of less than half a pitch size between laser diodes in the vertically stacked multi-emitter laser sources, as is illustrated in FIG. 14A. A laser diode chip or laser source as shown in FIG. 14A may have dimensions of about 100 micron in the horizontal direction and between 400-600 micron in the vertical direction. The active area herein is typically about 100 micron in the vertical direction and several microns in the horizontal direction.

The sub-mounts may vary in thickness between 0.3 mm to 0.8 mm or other ranges. Preferably the sub-mounts have a height that allows manipulation, so preferably they should not be too small. All measurements related to the dimensions of features may vary with 10% in accordance with one embodiment of the present invention or up to 25% in accordance with another embodiment of the present invention.

In accordance with an aspect of the present invention, the top of the active area of the laser diode chip captured or sandwiched between two sub-mounts is positioned at a distance of between about 0.2 mm and 1 mm from the top of the carrier, this distance being determined from the half pitch for laser diode chips in a vertical stack sandwiched between sub-mounts, as defined earlier above.

Another way to describe a preferred position or height of the laser diode relative to the carrier is to apply a line drawn from the top of the active area of the laser source in a vertical cross-sectional view that is perpendicular to the light-emitting area of the laser source, down through the sub-mount downwards to the carrier under a defined angle between the drawn line and a line perpendicular to the carrier, wherein an angle of about 45° would make the line cross into the carrier directly from the sub-mount. If the sub-mounts that sandwich the laser source have different thicknesses, both of the sandwiching sub-mounts should agree with the 45° rule. A line measured under 45° with a line perpendicular to the carrier base and that is measured from the top of the active area of the laser diode chip will cross through the sub-mount of the laser diode chip but not through the sub-mount that is adjacent to the sub-mount of the laser diode chip. For practical reasons, the 45° may be set in one embodiment of the present invention to be 45° plus or minus 5°. In another embodiment of the present invention the angle rule may be set to be 45° plus or minus 10°.

If the emitter is too close to the carrier (<100 μm for example) in some embodiments, the chance that it may get shorted (for example, by solder balls created using conventional bonding) may increase. In one embodiment of the present invention the solder layer thickness for vertical stacking is optimized to reduce or eliminate such artifacts and get the bottom of the laser source even closer to the carrier to 50 micron. It may be possible to get as close as 10 micron to the carrier, but the manufacturing margins will be very tight, requiring expensive manufacturing efforts. The thermal gain from moving from a 50 micron gap to a 10 micron gap may not be significant enough in many applications to warrant the additional costs. In some embodiments of the present invention, thermal advantages of moving to a 10 micron gap, however small, may be sufficient for those embodiments to warrant the additional manufacturing cost.

In accordance with one embodiment of the present invention the distance of the center of emitters or multiple emitters to the mounting plane or carrier in a vertically stacked arrangement is precisely aligned such that the deviation from the median center line is preferably 1/10 of the emitter width or less. This helps reduce the overall beam size when all the laser beams are combined, therefore improving the overall beam quality. If the sub-mount side edge and laser diode chip side edge are close enough, both edges could be identified under one microscope view field, making precision alignment easier to achieve. For bonding tools with very precise motors for translation, achieving an alignment accuracy of 5-10 micron is not a problem even if the machine has to identify the two edges separately. The carrier 401, in one embodiment of the present invention, hosts at least between 5 and 10 laser diode chips in a single assembly. In this embodiment, one laser diode chip is attached on either side to sub-mounts 402 and 404. Electrical current is provided via patches 405 and 406. The desired laser radiation is identified by the arrows 407. It is further noted that optics, such as collimators, will be applied but are omitted from FIG. 4.

In one embodiment of a laser diode assembly 500, shown in FIG. 5, radiation from the emitting surface of each laser diode chip is transmitted through a collimating lens 511 and is emitted in a direction parallel to the surface of the carrier base 401. Other optics can be used with the laser module of the present invention.

In one embodiment of the present invention, shown in FIG. 5, each of the plurality of sub-mounts are indirectly attached to a conductive pad 501, 502 or 503. In this embodiment, there is a plurality of conductive pads 501 to 503 attached to the surface of the carrier base 401 in a row with a space 510 between adjacent conductive pads. The sub-mounts 505 and 507 are conductive sub-mounts. Each successive pair of the plurality of conductive sub-mounts (e.g. 507 and 512) between a first and a last of the plurality of conductive sub-mounts have a mounting surface attached to one of the plurality of conductive pads (e.g. 502).

To further clarify the arrangement of the laser source and the sub-mounts relative to the carrier, it is noted that each one of the plurality of laser diode chip has a dimensional length that is greater than a dimensional width that is greater than a dimensional thickness. The radiation surface of each laser diode chip is an area defined by the dimensional thickness and the dimensional width. The bonding surfaces of each laser diode chip are areas defined by the dimensional length and the dimensional width. The first and second open surface of each laser diode chip are areas defined by the dimensional length and the dimensional thickness, and are the top and bottom surfaces of each laser diode chip shown in FIG. 5.

As shown in FIG. 5, each one of the plurality of laser diode chips has a first bonding surface conductively attached to one of the plurality of conductive sub-mounts attached to a first of the conductive pads and has a second bonding surface conductively attached to a second of the plurality of conductive sub-mounts and when radiation is emitted from the radiation surface it is emitted parallel to a surface of the carrier base. For example, in FIG. 5, a first bonding surface of the laser diode 506 is bonded to sub-mount 505 and a second bonding surface of the laser diode 506, on the side opposite the first bonding surface, is bonded to sub-mount 507.

The first open surface of each one of the plurality of laser sources (i.e. the bottom surface facing the carrier 401) is closer to the surface of the carrier 401 than the second open surface which is on the top of the laser diode 506, opposite the first open surface. A gap between the first open surface of each one of the plurality of laser diodes 506 and the surface of the carrier base 401 is less than a predetermined distance, as described and claimed herein.

Referring to FIG. 5, the carrier 401 includes a plurality of conductive pads 501, 502 and 503 attached to the surface of the carrier base 401 in a row with a space between adjacent conductive pads. Thus, the pads 501, 502 and 503 are electrically isolated from each other. The pads provide electrical current to the sub-mounts, for instance sub-mounts 505 and 507, when the sub-mounts are made of an electrically conducting material, such as copper-tungsten (CuW). The side view of FIG. 5 illustrates part of what a viewer looking into the side of the assembly from where the radiation is coming would see. Sub-mounts 505 and 507 sandwich the laser diode chip 506.

Note that a collimator 511 is not shown with laser diode 506. It is understood that a collimator is present at the output of each laser diode 506. The sub-mounts are mounted on electrically conducting pads 501, 502 and 503 in a conventional manner which are used to provide electrical current. The whole assembly sits on carrier 401. One may optimally keep a distance 508 between two sub-mounts sitting on the same pad. This allows optimal alignment of the components on the carrier. However, the sub-mounts may also touch without a space.

In one embodiment of the present invention the first open surface (i.e., the bottom surface facing the carrier 401) of each one of the plurality of laser sources 506 is closer to the surface of the carrier than the second open surface (i.e. the top surface) of the laser diode 506 into the top surface 512 of the sub-mounts 505 and 507. Thus, the space 510 is less than the space 513. In another embodiment the space 510 from the carrier to the laser diode is fifty (50%) percent of the size of the distance 513.

In one embodiment of the present invention, the sub-mounts all have the same dimensions or size. This is, for instance, illustrated in FIGS. 4 and 5. A thickness of each one of the plurality of sub-mounts is in one embodiment of the present invention is between 0.5 and 1 mm.

As discussed earlier above, a laser diode 506 formed by a laser diode chip mounted between two sub-mounts can be tested individually before being mounted on the subcarrier. This prevents the installation of a faulty laser diode on a carrier 401 which would be a costly mistake that results in the waste of time and parts. In accordance with an aspect of the present invention, each combination of sub-mounts and laser diode chip is individually tested for laser emission before being mounted on the carrier base 401.

In one embodiment of the present invention, each of the plurality of sub-mounts have a free surface 513 opposing a surface attached to the carrier base 401 that is not attached to another carrier. This is illustrated in FIGS. 4 and 5. A free (upper) surface is maintained and the extra cost of mounting a carrier are prevented by providing cooling or heatsink capabilities through the carrier base 401 and by mounting the laser diode chips near the carrier base 401.

In one embodiment of the present invention, a distance of each of the plurality of laser sources to the free surface is between 10 micron and 800 micron, depending on size of sub-mounts and laser source. While a short gap is maintained from a laser diode chip 506 to the carrier 401, there are benefits to maintain a larger distance 513. This is believed to allow for improved handling of individual laser diodes and for smile management. In one aspect of the present invention, a minimum of distance 513 of each of the plurality of laser sources 506 to the free surface of the sub-mounts is greater than 50 percent of the distance of gap 510 between the laser source 506 and the carrier 401.

In accordance with an embodiment of the present invention, each laser diode chip is bonded to two of the plurality of sub-mounts that are not bonded with another laser source. This is illustrated in for instance FIGS. 4 and 5. Thus, each laser diode chip (such as 407 and 506) is bonded to a set of sub-mounts unique to a specific laser diode chip. For instance, diode 506 is bonded to sub-mounts 505 and 507, and sub-mounts 505 and 507 are not bonded to any other laser diode chip.

Referring to FIG. 5, the current flow through the laser diode 506 is now explained. Excitation current that causes the diodes to generate radiation flows from a conductive pad 501 and up through the conductive sub-mount mounted to the pad 501. Electric current then flows through the laser diode (shown with the collimating lens 511) and through the conductive sub-mount leaving surface 512. The current then flows through the conductive pad 502, through the sub-mount 507, through the laser diode 506, through the sub-mount 505 and through the conductor pad 503. Each successive laser diode 506 is excited in this manner, causing the emission of radiation.

In accordance with another embodiment of the present invention, shown in FIG. 6, the assembly includes conductive pads 601 and 602, attached to the surface 603 of the carrier base 604 in a row. Laser diodes 611 are mounted between each pair of sub-mounts. The sub-mounts are conductive sub-mounts with a mounting surface. Conductive sub-mounts 610 and 605 mounted to conductive pads 601 and 602, respectively. Each adjacent sub-mount between sub-mounts 605 and 610, including 606, 607, 608 and 609, is electrically connected to conduct current. This means that the current flows through the sub-mounts and laser diode chips in the intermediate units, and only the bookend sub-mounts 605 and 610 are connected to conductor pads.

In another embodiment of the present invention, the adjacent sub-mounts of FIGS. 5 and 6 can be replaced with a single sub-mount, thereby reducing component count. FIG. 7 illustrates an embodiment similar to FIG. 5, but with adjacent sub-mount pairs (e.g., 507 and 512) replaced with a single sub-mount 707. Thus, conductive pads 702 to 705 are mounted on a carrier 701. Each of single sub-mounts 706 to 709 are mounted on pads 702 to 705, respectively. Each laser diode chip 710, 711 and 712 is mounted between the single sub-mounts. The embodiment of FIG. 6 can be similarly modified so that each pair of adjacent sub-mounts is replaced with a single sub-mount.

Figure 8:
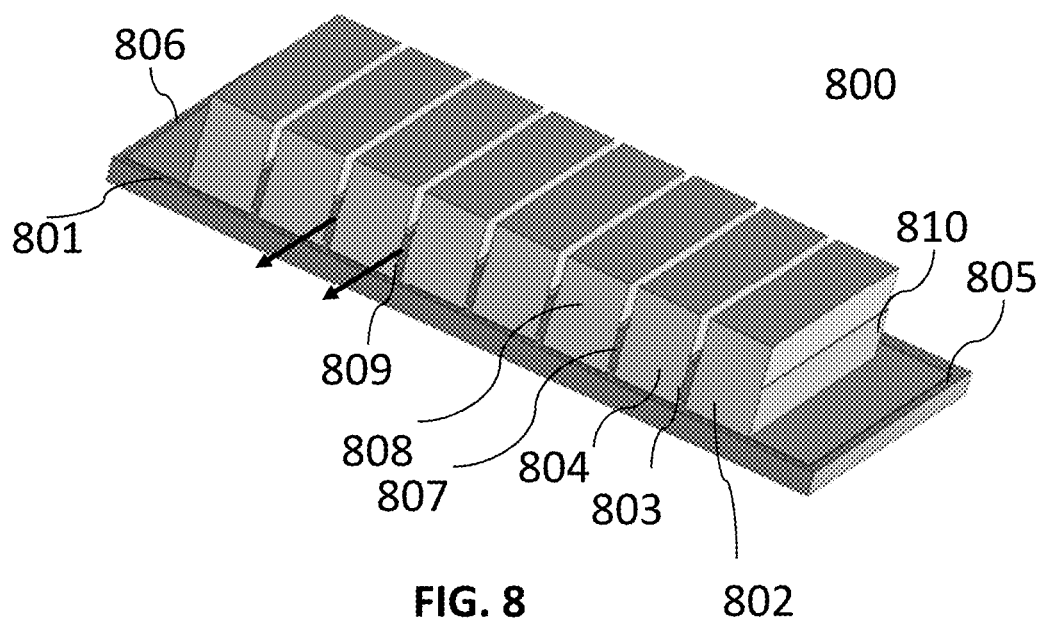
FIG. 8 illustrates a further embodiment of the present invention wherein sub-mounts are partially covered by a conductive layer.

FIG. 8 illustrates another embodiment of the assembly 800 of the present invention. In this embodiment, the sub-mounts 802, 804 and 808 can be conductive or non-conductive and are mounted on carrier 801. If non-conductive, the sub-mounts have conductive layers wrapped around from one side to another. Thus, the sub-mounts can be made from a ceramic, such as AlN. In FIG. 8, laser sources 803 and 807 are mounted between sub-mounts 802, 804 and 808 such that a single sub-mount is between each laser source. Sub-mount 802 is an end sub-mount that may be connected to a connection pad 805 via a conductive layer 810 that partially or totally covers sub-mount 802.

The conductive layer 810 can be U-shaped so that it covers both sides of a sub-mount, as well as the bottom of the sub-mount. Thus, in FIG. 8, the conductive layer 810 wraps around the bottom of the sub-mount 802. Each sub-mount has conductive layer 810 similarly attached to it. The arrow 809 extending from one of the laser diodes indicates that the side surfaces are the desired emitting surfaces.

The connection of the sub-mount 802 to the conductive layer 810 is conventional. For example, these components can be plated, have thick film or have thin film conductive layers. The connection of the conductive layer 810 to the carrier 801 is also conventional. For example, it can be attached with solder or thermally conductive adhesive.

Figure 9A:
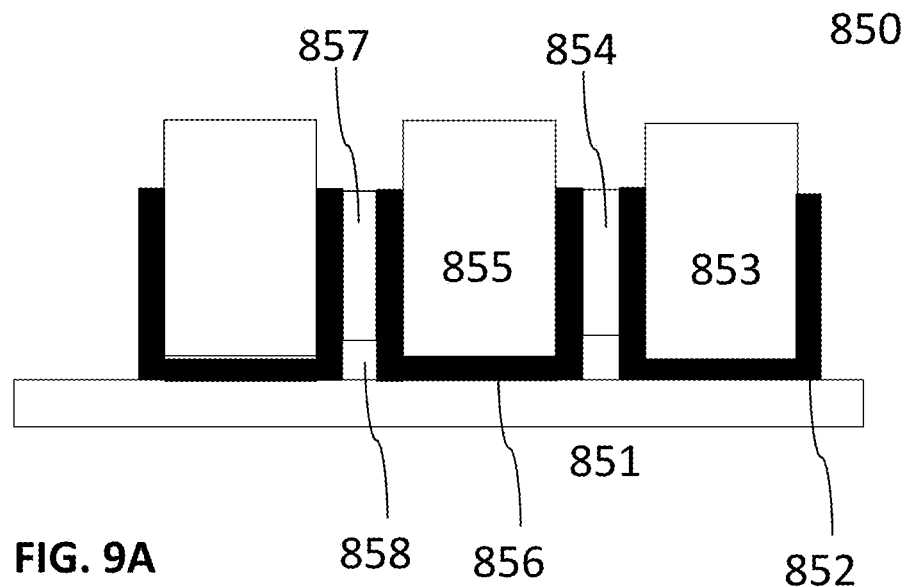
FIGS. 9A and 9B further illustrate various aspects of the embodiment of FIG. 8.
Figure 9B:
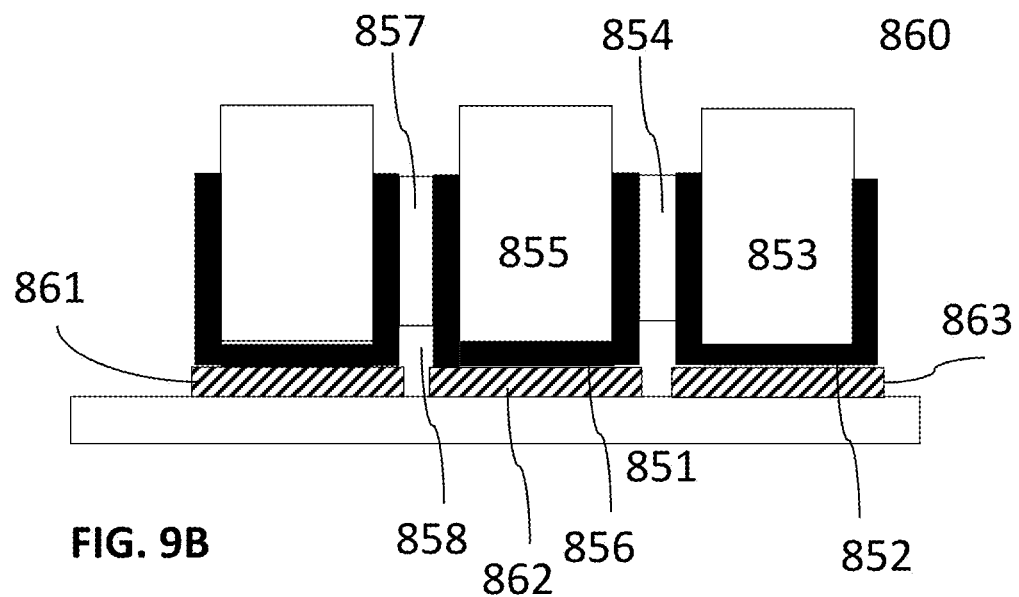

The embodiment of FIG. 8 is further illustrated in FIGS. 9A and 9B. Assembly 850 with a carrier 851 is shown in FIG. 9A. The laser diode chips 854 and 857 are shown. Each laser diode chip has a gap 858 between a lower open surface and the carrier 851. The sub-mounts 853 and 855 are covered with separate conductive layers 852 and 856. It is clearly shown that laser diode chip 854 has adjacent sub-mounts 855 and 853 and that sub-mount 855 is conductively bonded to laser diode chips 857 and 854 and the intermediate conductive layers. One can also see that the sub-mounts are partially covered with a conductive layer. For instance sub-mount 855 is only partially covered with conductive layer 856. The covered sub-mounts may for instance be bonded to carrier 851 by adhesive bonding. In a further embodiment of the present invention an assembly 860, similar to 850, is illustrated in FIG. 9B. In this case the sub-mounts, which may be partially covered, are bonded to the carrier 851 by solder pads, identified as 861, 862 and 863.

In the embodiment of the present invention illustrated in FIG. 8, the sub-mounts are preferably made of a ceramic or other electrically insulating material. The carrier 801 also is made of a ceramic or electrically insulating material or at least electrically insulates the conductive layers around the sub-mounts from each other.

The embodiments of the present invention allow for a very compact realization of the assembly. In accordance with an aspect of the present invention the assembly has eight laser diode chips and has a volume not greater than 20×30×10 mm³. The volume of the assembly includes the total height of the assembly and the size of the carrier.

Figure 10:
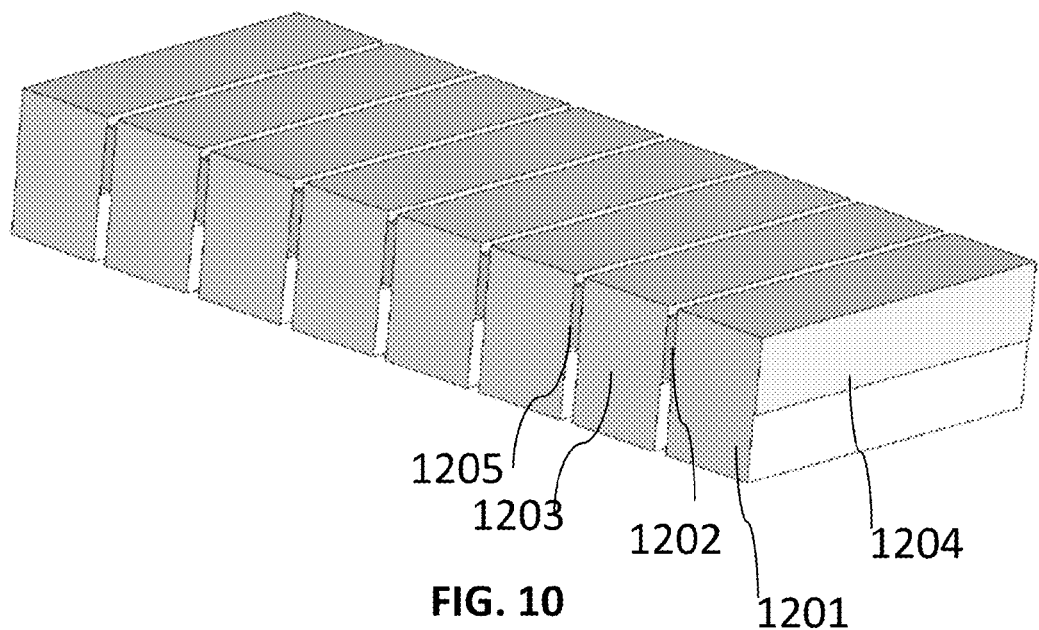
FIG. 10 illustrates another embodiment of the present invention.
Figure 11:
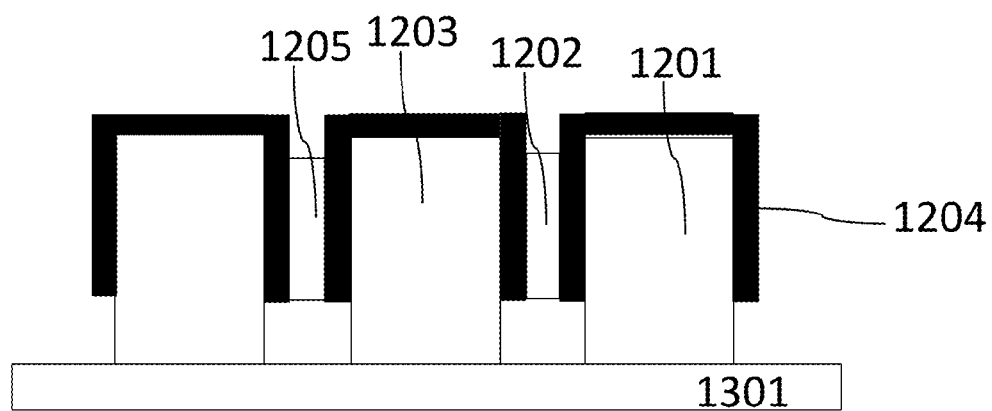
FIG. 11 further illustrates various aspects of the embodiment of FIG. 10.

FIGS. 10 and 11 illustrate another embodiment of the present invention. It shows a configuration of the earlier discussed single shared sub-mounts. For instance sub-mount 1203 is shared by laser diode chips 1205 and 1202. The sub-mount 1201 has a conductive layer 1204 with covers partially the side, the top and the other side surface of the sub-mounts. Each sub-mount has such a layer that can provide electrical current to the assembly of laser diodes. The assembly of FIG. 10 is somewhat like the one illustrated in FIG. 8 but upside-down, so that the partially covering conductive layer covers at least a part of the top surface of a sub-mount. This is illustrated in FIG. 11 wherein carrier 1301 is at the opposite side of a covered surface. In this embodiment, the sub-mount is preferably electrically non-conductive.

Figure 12:
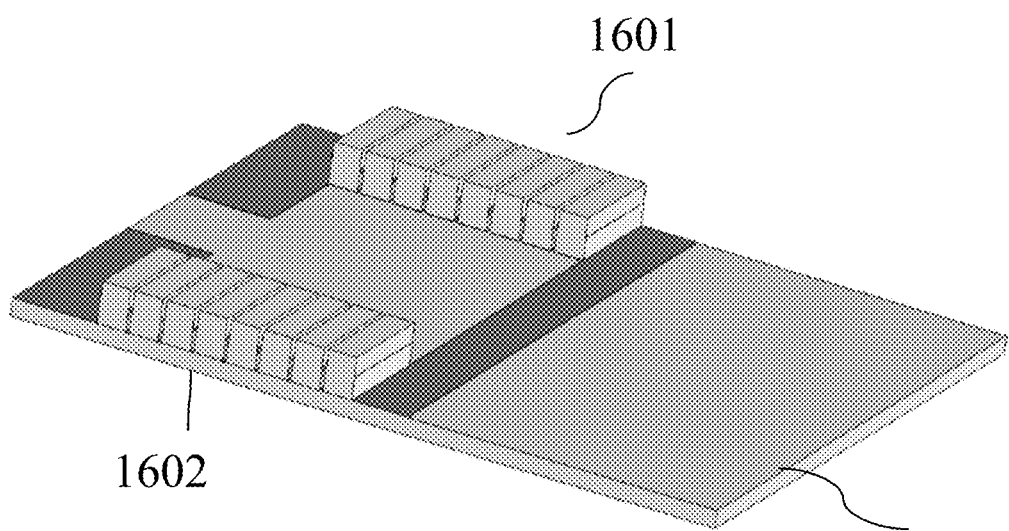
FIGS. 12 and 13 illustrate a use of two assemblies in accordance with an aspect of the present invention.
Figure 13:
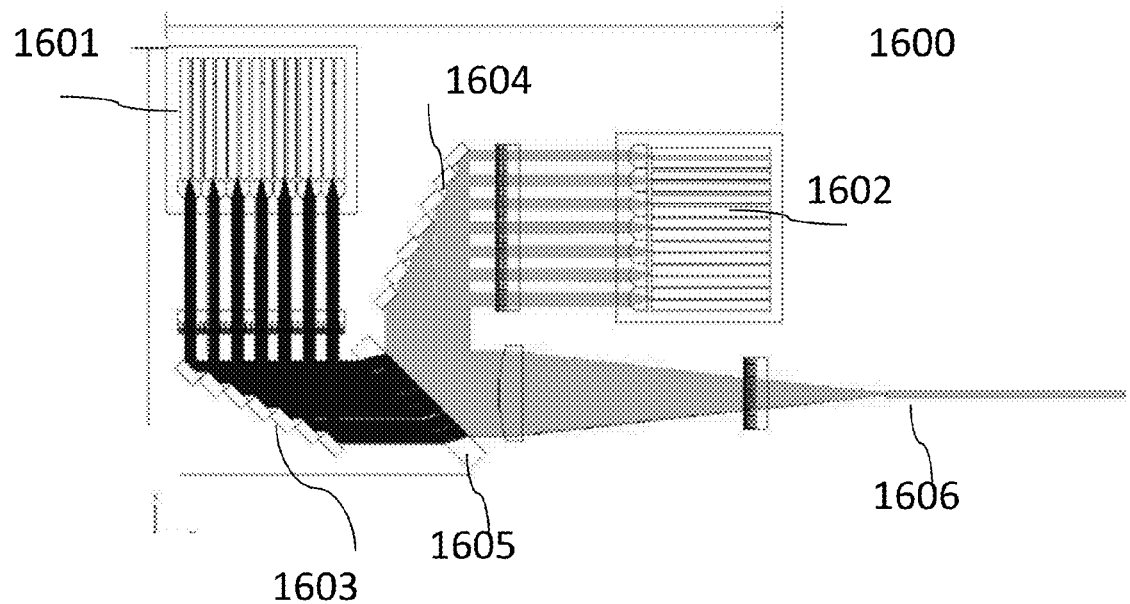

As described above, a laser assembly in accordance with the present invention can include eight, or even more laser diode chips. As shown in FIGS. 12 and 13, one, two or more of the laser assemblies can be mounted on a carrier. In FIG. 12, a first plurality of vertically oriented laser sources 1601 and a second plurality of vertically oriented laser sources 1602 are mounted on a carrier 1354.

A sample optical design 1600 to couple the output of the two laser assemblies 1601 and 1602 is shown in FIG. 13. The outputs from the two laser assemblies 1601 and 1602 are reflected with mirrors 1603 and 1604, respectively to an optical combiner 1605 and then into an optical fiber 1606.

Accordingly, embodiments of the present invention provide very compact platforms for high-power, high-brightness diode laser modules based on single emitters. Related modules in the market typically has a dimension of 40×80× 15 mm³; modules as small as 2030×10 mm³ may be possible in accordance with various aspects of the present invention.

In addition, aspects of the present invention enable the ability to cool laser diode chips from both P-side and N-side, which may reduce the thermal lensing effect that limits the laser beam quality at high current levels. By eliminating the need for wirebonds and sophisticated beam rotation optics, embodiments of the present invention may also reduce the complexity of the whole module and result in a more robust package.

Compared to bar-based diode laser modules, aspects of the present invention offer the extra advantage that individual CoS sub-assembly can be tested and sorted out before further packaging, thus improving performance and yield of the final product.

Figure 15A:
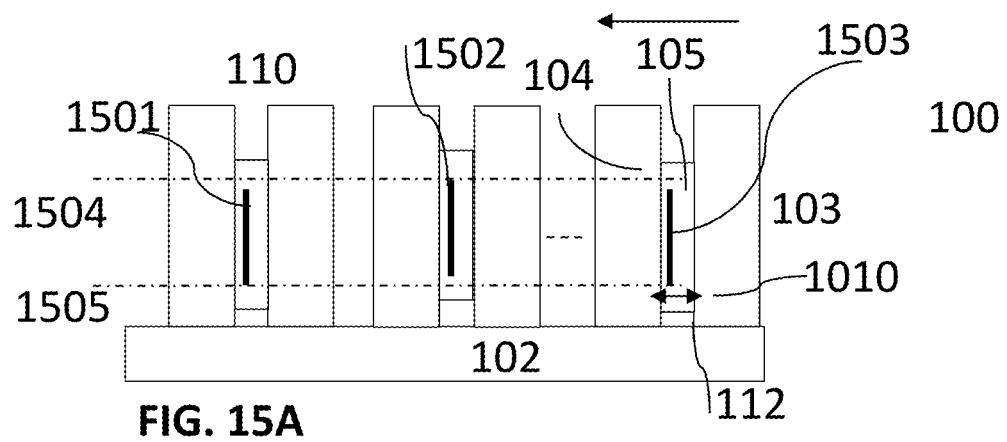
FIGS. 15A and 15B illustrate the alignment of the emitting apertures or emitting areas relative to each other and relative to the base carrier.
Figure 15B:
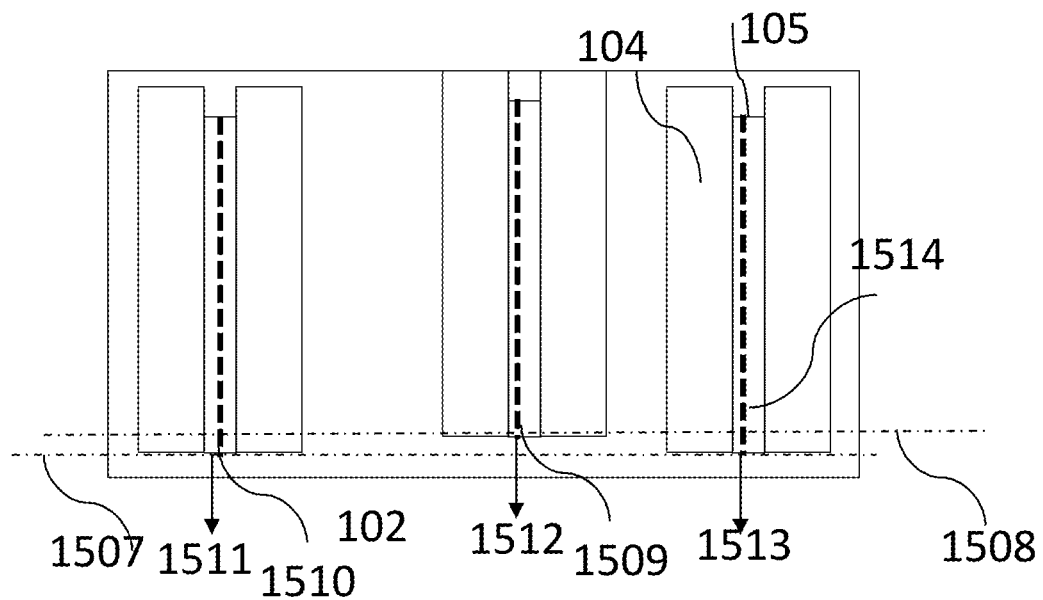

As described earlier and in accordance with an aspect of the present invention, the emitting areas of the laser diode chips assembled in one embodiment of the present invention are all aligned such that a single lens can be used for slow axis collimation. Therefore the emitting areas are aligned to each other such that the total width of all emitting areas in a stack is no larger than 110% of the width of an individual emitting area and that all emitting surfaces are aligned in one plane perpendicular to the beam propagation. This is illustrated in FIG. 15A and FIG. 15B. The numerals in these figures have the same meaning as provided in earlier provided FIG. 1. Numerals 1501, 1502 and 1503 indicate the emitter or active areas of sandwiched laser diode chips. The lines 1504 and 1505 illustrate the highest and the lowest height of the active areas of the plurality of sandwiched laser diode chips that are part of the assembly, relative to the carrier 102. The lines 1504 and 1505 determine the actual width or effective width of the laser radiation exiting the assembly perpendicular to the emitting areas. One can see that the width of the exit radiation is determined by the variation in the positioning of the laser diode chips and their radiating emitting or active areas. The active layers 1509, 1510 and 1514 each of which ends in the active area of the respective diode laser chip, are depicted as dotted lines in FIG. 15B, as they would not be visible in the above view of FIG. 15B.

One would like to apply a single lens or a single array of lenses for slow axis and fast axis collimation, respectively, that were prepared pre-installation on the assembly. It is clear that a variation in positioning of the individual laser diode chips relative to the carrier that is large, would make it hard to prepare the appropriate single lens or single array of lenses. However, if the variation of the positioning is controlled within predefined boundaries, then it is possible to apply a pre-fabricated single collimation lens or lens array without further adjustment. In accordance with an aspect of the present invention, the highest position of a top of any of the radiating or emitting areas and the lowest position of any of the radiating or active areas of the laser diode chips that are part of the assembly and which determines the width of the combined exit radiation of the assembly, is within 10% of the width of the radiation of the laser diode chip with the smallest radiation width at the point of exit. This can be achieved at a reasonable effort and cost. In a further embodiment the 10% variation is determined from the width of the exit radiation of the laser diode chip with the largest radiation width. In general and for practical purposes the width of active areas of the laser diode chips are practically identical.

In yet a further embodiment the variation of the width of the combined radiation of the active areas is not greater than 20% of the radiation width of the laser diode chip with the smallest radiation width. In general, the individual laser diode chips are made within very tight tolerances and may be considered to be identical. In that case the variation is within 10% or 20% of the size of the radiation width of a standard laser diode chip.

In accordance with another aspect of the present invention, the active areas of the laser diode chips assembled in one embodiment of the present invention are all aligned such that a prefabricated single micro-lens array can be used for fast axis collimation. Therefore the active areas of the individual laser diode chips and the maximum offset of the active area of two laser diode chips that are aligned in a plane perpendicular to the beam propagation direction is not greater than 1 μm. The pitch of the laser diode chips is preferably aligned with an accuracy of better than 1 μm.

The alignment issue is further illustrated in FIG. 15B which provides a top view of the assembly. Line 1507 shows a desired position of a sub-mounted laser diode chip and 1508 illustrates a variation of a position of a sandwiched laser diode chip relative to the line 1507. The laser diode chips are all aligned in a flush manner with sub-mounts. FIG.

15B thus illustrates a variation or offset in positioning of the sub-mounts relative to each other and consequently a different relative position of the layers 1509, 1510 and 1514 which are the active layers corresponding to emitting active areas 1501, 1502 and 1503 in FIG. 15A. The active areas are the end surfaces of the active layers of the laser diode chips and output the laser radiation of the laser diode chips. By keeping the misalignment or offset of sub-mounts within lines 1507 and 1508 at 1 micron or less and the pitch variation of the laser diode chips at 1 micron or less and thus control the position relative positions or offsets of 1511, 1512 and 1513 of the different active areas, one can apply a pre-defined array of lenses for fast axis collimation.

Another way to define the deviation in alignment of diode laser chips in the direction of radiation, is to determine for each diode laser chip a plane through the active area, which is an end surface, perpendicular to radiation propagation from the active area and perpendicular to the carrier. This would be a plane in the plane of the image provided in FIG. 15A or parallel to that plane. One can thus create a plurality of parallel or substantially parallel planes that each determines the plane of the active area of each laser diode chip. Preferably, all these planes coincide into a single plane indicating that all active areas are aligned in one plane. In practical circumstances some misalignment or offset may occur. By careful placement and checking for alignment one can assure that the maximum alignment error or offset between active areas is never more than 1 micron or is less than 1 micron or micrometer. This misalignment if called the offset between the active areas of the laser diode chips in an assembly.

By controlling misalignment of laser diode chips in a laser diode assembly, one can rely on margins of alignment to be met. This then allows the use of components such as lenses, lens arrays, lens mounts and other components and features of components that can be fabricated, prefabricated or placed in other components before end assembly. This prevents expensive post-assembly re-alignment or repair.

While there have been shown, described and pointed out fundamental novel features of the invention as applied to preferred embodiments thereof, it will be understood that various omissions and substitutions and changes in the form and details of the methods and systems illustrated and in its operation may be made by those skilled in the art without departing from the spirit of the invention. It is the intention, therefore, to be limited only as indicated by the scope of the claims.

The invention claimed is:

1. A laser diode assembly, comprising:
   a carrier base having a surface;
   a plurality of sub-mounts, each sub-mount in the plurality of sub-mounts attached directly or indirectly to the surface of the carrier base;
   a plurality of laser diode chips, each of the plurality of laser diode chips having two opposing bonding surfaces and an active layer between the two bonding surfaces, the bonding surfaces and the active layer being perpendicular to the surface of the carrier base, each of the two opposing bonding surfaces attached to one of the plurality of sub-mounts so that each of the plurality of laser diode chips including the active layer is vertically oriented relative to the carrier base, each laser diode chip having an active area at the end of the active layer, with a top relative to the carrier base that can emit radiation parallel to the surface of the carrier base when powered by an electric current; and
   wherein a distance of the top of the active area of each of the plurality of laser diode chips to the carrier base is not greater than half a pitch, plus or minus 10%, between adjacent ones of the plurality of laser diode chips in the laser diode assembly.

2. The assembly of claim 1, wherein the distance of the top of the active area of each laser diode chip in the plurality of laser diode chips to the carrier base is between 0.2 mm and 1 mm.

3. The laser diode assembly of claim 1, wherein a distance between a bottom of each laser diode chip in the plurality of laser diode chips to the carrier base in the laser diode assembly is less than 50 microns.

4. The laser diode assembly of claim 1, wherein a distance of a center of the active area of each laser diode chip in the plurality of laser diode chips to a median center line through the active areas of the laser diode chips in the plurality of laser diode chips is not greater than $\frac{1}{10}$ of a width of the active area of any of the laser diode chips.

5. The laser diode assembly of claim 1, wherein each active area of a laser diode chip in the plurality of laser diode chips determines a plane perpendicular to radiation from the active area and perpendicular to the carrier to form a plurality of substantially parallel planes and a distance between any two planes in the plurality of planes is not greater than 1 micrometer.

6. The laser diode assembly of claim 5, further comprising:
   a prefabricated microlens array for fast axis collimation of radiation generated by the plurality of laser diode chips.

7. The laser diode assembly of claim 1, further comprising a single collimating lens to collimate laser radiation along the slow axis of the laser diode assembly.

8. The laser diode assembly of claim 1, further comprising:
   a plurality of conductive pads attached to the surface of the carrier base in a row with a space between adjacent conductive pads;
   the sub-mounts being conductive sub-mounts, each of the plurality of conductive sub-mounts having a mounting surface attached to one of the plurality of conductive pads; and
   each of the plurality of laser diode chips being mounted on a conductive sub-mount at a position above the space between adjacent conductive pads.

9. The laser diode assembly of claim 8, wherein each one of the plurality of sub-mounts has the same size.

10. The laser diode assembly of claim 8, wherein a thickness of each one of the plurality of sub-mounts is between 0.3 and 0.8 mm.

11. The laser diode assembly of claim 1, wherein the assembly has more than 5 laser diode chips and occupies an area not greater than 20 mm×10 mm.

12. The laser diode assembly of claim 1, wherein each of the plurality of sub-mounts is made of a ceramic material that is at least partially covered with a layer of conducting material on a first side and a second side, each to be attached to a different laser diode chip.

13. A laser diode assembly, comprising:
   a carrier base;
   a plurality of individual sub-mounts, each of the plurality of sub-mounts being a ceramic material that is at least partially covered with a layer of conducting material on a first side and a second side, each to be attached to a different laser diode chip, each of the plurality of sub-mounts being attached directly or indirectly to the carrier base;

a plurality of laser diode chips, each of the laser diode chips having a first and a second mounting side, each of the first and second mounting sides of the plurality of laser diode chips being attached and electrically connected to the layer of conducting material of a different sub-mount in the plurality of sub-mounts; wherein each one of the plurality of laser diode chips is vertically oriented relative to the carrier base and has an open surface that can emit radiation parallel to the surface of the carrier base; and wherein a distance of a top of an active area of each of the plurality of laser diode chips to the carrier base is not greater than half a pitch, plus or minus 10%, between individual laser diode chips in the laser diode assembly.

14. The laser diode assembly of claim 13, wherein the conducting material covers a portion of each side of each sub-mount and also covers at least part of a bottom mounting surface of each sub-mount to be mounted on the carrier base.

15. The laser diode assembly of claim 13, wherein the conducting material covers a portion of each side of each sub-mount and also covers at least a top surface of each sub-mount which is not attached to the carrier base.

16. The laser diode assembly of claim 13, wherein a distance of a center of the active area of each laser diode chip in the laser assembly to a median center line through the active areas of the laser diode chips in the laser diode assembly is not greater than $\frac{1}{10}$ of a width of a widest active area of any of the laser diode chips in the laser diode assembly.

17. The laser diode assembly of claim 13, wherein the laser diode assembly has more than 5 and up to 10 laser diode chips within a surface area of the carrier base not greater than 20×10 mm$^2$.

18. The laser diode assembly of claim 13, further comprising:

a single lens for slow axis collimation of radiation generated by the plurality of laser diode chips.

19. The laser diode assembly of claim 13, further comprising:

a prefabricated microlens array for fast axis collimation of radiation generated by the plurality of laser diode chips.

20. The laser diode assembly of claim 13, wherein an offset between the active areas of two laser diode chips mounted on the carrier base is not greater than 1 micron.

* * * * *